(12) United States Patent
Fattaruso et al.

(10) Patent No.: US 6,246,352 B1
(45) Date of Patent: Jun. 12, 2001

(54) ANALOG-TO-DIGITAL CONVERTER WITH FLUSH ACCESS TO DIGITAL-TO-ANALOG RESISTOR STRING

(75) Inventors: John W. Fattaruso, Dallas, TX (US); Shivaling S Mahant-Shetti, Karnataka (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/365,082

(22) Filed: Jul. 30, 1999

(51) Int. Cl.[7] ................................................. H03M 1/12
(52) U.S. Cl. ......................... 341/156; 341/163; 341/154
(58) Field of Search ................................... 341/144, 155, 341/156, 158, 161, 162, 163, 154

(56) References Cited

U.S. PATENT DOCUMENTS

| | | | |
|---|---|---|---|
| 4,903,028 | * 2/1990 | Fukushima | 341/156 |
| 4,924,227 | * 5/1990 | Mangelsdorf | 341/159 |
| 5,068,662 | * 11/1991 | Guddanti et al. | 341/161 |
| 5,099,240 | * 3/1992 | Nakatani et al. | 341/156 |
| 5,675,340 | * 10/1997 | Hester et al. | 341/156 |
| 5,745,067 | * 4/1998 | Chou et al. | 341/156 |
| 5,835,046 | * 11/1998 | Larsson et al. | 341/155 |
| 5,923,277 | * 7/1999 | Takeda | 341/156 |
| 6,127,957 | * 10/2000 | Fattaruso et al. | 341/154 |

* cited by examiner

*Primary Examiner*—Michael Tokar
*Assistant Examiner*—Steven S. Paik
(74) *Attorney, Agent, or Firm*—Ronald O. Nerrings; Wade James Brady, III; Frederick J. Telecky, Jr.

(57) ABSTRACT

An analog-to-digital converter ("ADC", 40) comprising an input ($V_{IN2}$) for receiving an input analog voltage. The ADC further comprises a digital-to-analog circuit, comprising a meandering string (12') of series connected resistive elements (R0'–R14') having a plurality of voltage taps (T0'–T15'), as well as a number of bit lines (BL0'–BL3') and a number of word lines (WL0'–WL3'). For a given input analog voltage, the given input analog voltage is closest to a voltage at a selected one of the plurality of taps. In addition, the selected one of the plurality of taps is associated with one of the number of bit lines and one of the number of word lines. Additionally, the ADC further comprises a flash circuit (44, 46, 48, 50, 42, CAT0'–CAT3') coupled to receive the input analog voltage from the input and in response to identify either the one of the number of bit lines or the one of the number of word lines. Lastly, the ADC comprises an output ($V_{OUTD2}$) for providing a digital output value in part in response to the identified one of the number of bit lines or the one of the number of word lines.

20 Claims, 6 Drawing Sheets

| TAP | 98 | 96 | 94 | 92 | $I_3''{:}I_2''$ | $I_1''{:}I_0''$ |
|---|---|---|---|---|---|---|
| T0" | x | x | x | x | 00 | 00 |
| T1" | 0 | 0 | 0 | 1 | 00 | 01 |
| T2" | 0 | 0 | 1 | 1 | 00 | 10 |
| T3" | 0 | 1 | 1 | 1 | 00 | 11 |
| T4" | 0 | 0 | 0 | 0 | 01 | 00 |
| T5" | 1 | 0 | 0 | 0 | 01 | 01 |
| T6" | 1 | 1 | 0 | 0 | 01 | 10 |
| T7" | 1 | 1 | 1 | 0 | 01 | 11 |
| T8" | 0 | 0 | 0 | 0 | 10 | 00 |
| T9" | 0 | 0 | 0 | 1 | 10 | 01 |
| T10" | 0 | 0 | 1 | 1 | 10 | 10 |
| T11" | 0 | 1 | 1 | 1 | 10 | 11 |
| T12" | 0 | 0 | 0 | 0 | 11 | 00 |
| T13" | 1 | 0 | 0 | 0 | 11 | 01 |
| T14" | 1 | 1 | 0 | 0 | 11 | 10 |
| T15" | 1 | 1 | 1 | 0 | 11 | 11 |

US 6,246,352 B1

ANALOG-TO-DIGITAL CONVERTER WITH FLUSH ACCESS TO DIGITAL-TO-ANALOG RESISTOR STRING

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to data converters, and are more particularly directed to an analog-to-digital converter based in part upon a digital-to-analog converter.

Data converters may be used in various types of electronic circuits, or may be formed as a single integrated circuit device. Such converters typically take one of two forms, either as a digital-to-analog converter ("DAC") or an analog-to-digital converter ("ADC"). For the DAC, its operation converts an input digital signal to an output analog signal, typically where the amplitude of the output analog signal corresponds directly to the magnitude of the input digital signal. Conversely, the ADC converts an input analog signal to an output digital signal, typically where the value of the output digital signal corresponds directly to the amplitude of the input analog signal. In many configurations, both DACs and ADCs implement a resistor string that includes a number of series-connected resistors, where each resistor provides a voltage tap at each of its ends. Typically, the overall string is biased at opposing ends by two different reference voltages, where for example one such voltage is a positive voltage and the other is ground. Also in this regard, in an effort to maintain the linearity between the digital input and the analog output, a common concern in the art is to endeavor to ensure that each resistor in the string has as close to the same resistance value as all other resistors in the string. Accordingly, the resistor string forms a series voltage dividing network and each of the voltage taps is accessible as part of the operation for the data conversion (i.e., either from digital to analog, or analog to digital).

For further background to converters, it is noted that often ADCs are formed using one or more stages that include a DAC for each stage. Accordingly, by way of further introduction and example, FIG. 1 illustrates a typical configuration of a prior art DAC 10, and is detailed briefly below. Once an understanding for such a DAC is presented, additional aspects are treated whereby such a DAC is used in the prior art to form an ADC.

FIG. 1 illustrates a typical configuration of a prior art DAC 10, and is detailed briefly here with additional detail ascertainable by one skilled in the art. By way of example and as appreciated later, DAC 10 is a 4-input 16-output DAC, while numerous other dimensions may exist for different DAC configurations. In general and as detailed below, DAC 10 is operable to receive a 4-bit input word, designated from least significant bit to most significant bit as $I_0$–$I_3$. In response to the magnitude of these bits, DAC 10 outputs a corresponding analog voltage. Before detailing this operation, it is first instructive to examine the devices and connections of DAC 10. In this regard, DAC 10 includes a series-connected resistor string designated generally at 12, and that forms a meander in that it serpentines back and forth. Additionally, DAC 10 is generally a symmetric array in nature, having a number of bit lines in the vertical dimension and a number of word lines in the horizontal dimension. Since the example of DAC 10 presents a 4input 16-output DAC, the array of DAC 10 includes four bit lines BL0 through BL3, and four word lines WL0 through WL3. Also for the current example of a 4-to-16 DAC, resistor string 12 includes fifteen resistive elements R0 through R14. Resistive elements R0 through R14 may be formed using various techniques, where regardless of the technique ideally each resistive element has as close to the same resistance value as all other resistors in the string. Moreover, a voltage source $V_{REF1}$ is applied across resistor string 12, and may be of any suitable biasing voltage, which for current applications is typically on the order of 2.0 volts. For DAC 10, string 12 is biased between $V_{REF1}$ and ground, but it should be understood that in other configurations two different non-ground potentials may be connected at opposing ends of string 12. When ground is connected to one end of the string, it is easily appreciated that this difference of the potentials at the ends of the string equals $V_{REF1}$. In any event, given the equal resistance of each element in the string, $V_{REF1}$ is uniformly divided across the resistive elements of string 12.

Looking to the detailed connections with respect to resistive elements R0 through R14, each resistive element provides two taps and, therefore, two voltages that may be sampled as detailed below. For example, looking to resistive element R0, it provides a tap T0 and a tap T1, while resistive element R1 shares the same tap T1 and provides another tap T2, and so forth. Each tap has a switching device connected between it and a corresponding output bit line. In the current example, each of these switching devices is an n-channel field effect transistor, and is labeled for convenience by combining the abbreviation ST (i.e., switching transistor) with the same numeric identifier corresponding to the tap to which a source/drain of the transistor is connected. For example, a source/drain of transistor ST0 is connected to tap T0, a source/drain of transistor ST1 is connected to tap T1, and so forth. Further, the switching transistors are arranged so that a like number of taps are coupled via corresponding switching transistors to a corresponding one of the bit lines. In the current example of DAC 10, four taps are coupled in this manner to a corresponding bit line. For example, taps T0 through T3 are coupled, via corresponding switching transistors ST0 through ST3, to bit line BL0. As another example, taps T4 through T7 are coupled, via corresponding switching transistors ST4 through ST7, to bit line BL1. Each bit line BL0 through BL3 is coupled to a first source/drain of a respective column access transistor, CAT0 through CAT3, where the second source/drains of the column access transistors are connected to the output $V_{OUT1}$. In addition, column decoder 14 is coupled to receive the two most significant bits (MSBs) of the 4-bit word input to DAC 10, and in response column decoder 14 controls the gates of column access transistors CAT0 through CAT3.

Returning now to switching transistors ST0 through ST15, and given the array nature of DAC 10, it is further appreciated that the switching transistors are arranged so that a like number of switching transistors are controlled, via connection to their gates, by a corresponding word line that is further connected to row decoder 16. Given the current example of DAC 10, the gates of four switching transistors are coupled to each corresponding word line. For example, the gates of switching transistors ST0, ST7, ST8, and ST15 are coupled to word line WL0. As another example, the gates of switching transistors ST1, ST6, ST9, and ST14 are coupled to word line WL1. Lastly in this regard, and for reasons evident below, row decoder 16 is coupled to receive the two least significant bits (LSBs) of the 4-bit word input to DAC 10 (i.e., bits $I_1$ and $I_0$), and is also controlled in response to the least significant bit ("lsb"), $I_2$, of the two MSBs input to column decoder 14. More particularly, each least significant bit $I_0$ and $I_1$ is coupled as an input to a corresponding exclusive OR gate EOG0 and EOG1 as a first input, while the second input of exclusive OR gates EOG0 and EOG1 is connected to receive 12 (i.e., the least significant bit of the two MSBs input to column decoder 14). In response to these bits, row decoder 16 controls the gates of switching transistors ST0 through ST15 as detailed below.

The operation of DAC 10 is now described, first in general and then more specifically through the use of a few examples. A 4-bit digital word is connected to inputs $I_0$ through $I_3$ and ultimately causes signals to pass to column decoder 14 and row decoder 16. Generally, row decoder 16 includes sufficient logic circuitry or the like to respond by identifying/asserting one of word lines WL0 through WL3, thereby providing an enabling voltage to the gates of the four switching transistors coupled to the asserted word line. Similarly, column decoder 14 includes sufficient logic circuitry or the like to respond by identifying/enabling one of column access transistors CAT0 through CAT3, thereby causing the enabled transistor to pass the voltage from the corresponding one of bit lines BL0 through BL3 to output $V_{OUT1}$. In a simple case, the result of the above operations may be viewed by correlating the value of the 4-bit input to one of the sixteen decimal tap numbers. For example, if the 4-bit digital word equals 0001 (i.e., decimal value one), then DAC 10 enables a switching transistor and a column access transistor to couple the voltage at tap T1 to $V_{OUT1}$.

By way of detailed illustration of the operation of DAC 10, the example of an input equal to 0001 is now traced through DAC 10 in greater detail. From the input of 0001, its two MSBs are coupled to column decoder 14 and, thus, the value of 00 is received by column decoder 14. In response, column decoder 14 enables the gate of the column access transistor having a numeric identifier equal to the decimal value of the MSBs. Here, the MSBs of 00 equal a decimal value of zero and, thus, column decoder 14 couples an enabling voltage to the gate of column access transistor CAT0. Turning now to row decoder 16, it responds to the value of the two LSBs of the 4-bit input. However, note that these two LSBs pass through exclusive OR gates and, therefore, their values are unchanged when passed to row decoder 16 if the lsb equals 0, or their complements are passed to row decoder 16 if the lsb equals 1. Returning then to the example of a 4-bit input equal to 0001, the two LSBs equal 01 and the lsb of the two MSBs equals 0. Thus, the unchanged LSBs equal to 01 reach row decoder 16, and row decoder 16 in response asserts the word line having a decimal numeric identifier equal to the value of the two LSBs as received from gates EOG0 and EOG1. In the present example, therefore, row decoder 16 asserts word line WL1 high which, therefore, enables each of switching transistors ST1, ST6, ST9, and ST14. Recall also that column decoder 14 in this example enables column access transistor CAT0. As a result, the voltage from tap T1 passes via switching transistor ST1 to bit line BL0, and then passes via column access transistor CAT0 to output $V_{OUT1}$. Lastly, it is noted that the voltage at tap T1 is divided across one resistive element (i.e., R0) and, thus, for an input equal to 0001, the analog output voltage using voltage division is $\frac{1}{15}*V_{REF1}$.

To further illustrate in detail the operation of DAC 10, consider now the example of a digital input equal to 0111 as traced through DAC 10. At the outset, from the general operation described above, one skilled in the art will expect that since the decimal value of 0111 equals seven, then the tap selected by DAC 10 for output is tap T7. This expectation is now confirmed through a detailed examination of this example. From the input of 0111, its two MSBs of 01 are coupled to column decoder 14. In response, column decoder 14 enables the gate of the column access transistor having a decimal numeric identifier equal to the two MSB values of 01 and, hence, the gate of column access transistor CAT1 is enabled. Turning now to row decoder 16, note first that the lsb of the two MSBs in this example equals one; consequently, gates EOG0 and EOG1 cause the complements of the two LSBs to reach row decoder 16. Thus, the complements of the 11 LSBs are 00 and, therefore, the value of 00 reaches row decoder 16. In response, row decoder 16 asserts word line WL0 high since that word line has a numeric identifier equal to the value of the two complemented LSBs. When word line WL0 is asserted, it enables each of switching transistors ST0, ST7, ST8, and ST15. Recall also that column decoder 14 in this example enables column access transistor CAT1. As a result, the voltage from tap T7 passes via switching transistor ST7 to bit line BL1, and then passes via column access transistor CAT1 to output $V_{OUT1}$. Lastly, it is noted that the voltage at tap T7 is divided across seven of the fifteen resistive elements (i.e., R0 through R6) and, thus, for an input equal to 0111, the analog voltage output using voltage division is equal to $\frac{7}{15}*V_{REF1}$. Accordingly, the digital input of 0111 has been converted to an analog voltage which equals this divided voltage. Given this as well as the preceding example, one skilled in the art will further appreciate that with different digital inputs, any of the switching transistors of DAC 10 may be enabled along with enabling one of the column access transistors, and for each such combination of transistors there is a corresponding output that represents a divided voltage between zero volts or any value incrementing up from zero volts by $\frac{1}{15}V_{REF1}$, and up to an output equal to $V_{REF1}$.

FIG. 2 illustrates a block diagram of a prior art ADC 20, and which incorporates DAC 10 of FIG. 1. ADC 20 receives an analog input voltage $V_{IN1}$, at an input 22 to a comparator 24, where in the example of FIG. 2 it is assumed that $V_{IN1}$ is equal to or greater than ground. Input 22 is connected to the non-inverting input of comparator 24, and the inverting input 26 of comparator 24 is connected to receive the output voltage from output $V_{OUT1}$ of DAC 10. ADC 20 further includes a successive approximation register ("SAR") 28, having an input 30 connected to the output of comparator 24. Lastly, and in response to a clocked methodology described below, SAR 28 outputs a digital word along an address bus 32, where that digital word is connected to the input of DAC 10 and ultimately may be sampled to indicate the converted digital output, $V_{OUTD1}$, for ADC 20.

The operation of ADC 20 is as follows. In general, ADC 20 operates to convert an input analog voltage to an output digital value and, therefore, here the conversion is from the signal $V_{IN1}$ to the value $V_{OUT1}$. By way of example, and recalling that DAC 10 is a 4-bit device, then assume further that ADC 20 is likewise a 4-bit device, that is, the converted output value $V_{OUTD1}$ is a 4-bit word shown in FIG. 2 having bits $I_0$ through $I_3$. Turning to the operation in greater detail, initially the analog voltage $V_{IN1}$ is coupled to input 22, and a first clock signal is applied to SAR 28 to commence a sequence of operations. SAR 28 operates such that, for each successive clock to it, it performs a binary search routine in view of the feedback it receives from comparator 24. Binary search routines are generally known in the art and, in that regard, such a routine first determines the most significant bit of the eventual output (i.e., bit $I_3$) and with each successive clock cycle determines the next least significant bit of the eventual output. Further in this regard, note that while not shown, preceding ADC 20 (or as a part of it) there is included some type of sample-and-hold circuit. As appreciated from the following description, this sample-and-hold circuit maintains the input value for a necessary number of clock cycles while the binary search routine determines the final output. For the example of ADC 20, four total clock cycles are required to determine each of the four output bits in the converted output signal $V_{OUTD1}$ and, thus, the sample-and-hold circuit maintains the input voltage to ADC 20 during this determination. If required by the reader, this process is detailed still further immediately below.

To further demonstrate the operation of ADC 20 and the method of a binary search routine, the following discussion traces a n example whereby ADC 20 converts an incoming analog voltage to a digital value of 1011. In other words, for the following example, the magnitude of the analog input voltage is such that it should correspond to a digital value of 1011. As mentioned above, the determination of each of the four output bits requires a separate clock cycle of operation. Accordingly, each of these four clock cycles is discussed below.

In response to the first clock assertion to SAR 28, SAR 28 outputs a 4-bit address on bus 32, with the MSB of that address set to a logic high and leaving the remaining LSBs set to low. Thus, for this first clock assertion a digital value of 1000 is placed on bus 32. This value of 1000 is input to DAC 10 which, according to the techniques described earlier with respect to FIG. 1, outputs a corresponding analog voltage at output $V_{OUT1}$. Here, the $V_{OUT1}$ voltage is input to comparator 26, which therefore compares $V_{OUT1}$ with $V_{IN1}$ (i.e., the analog voltage being converted). The result of this comparison is fed back to SAR 28, and is either positive or negative based on the comparison. Recall that in the current example, the ultimate digital output is 1011. Accordingly, for this first clock cycle the comparison indicates that $V_{IN1}$ is greater than $V_{OUT1}$ because comparator 24 is comparing an analog voltage $V_{IN1}$ having a magnitude corresponding to a value of 1011 to an analog voltage $V_{OUT1}$ having a magnitude, as provided by DAC 10, corresponding to a value of 1000. In response to the positive output of comparator 24, it is concluded by SAR 28 that the digital output word corresponding to $V_{IN1}$ should be higher than the current word on bus 32, that is, the ultimate value Of $V_{OUTD1}$ is greater than the address 1000 currently on bus 32. By way of alternate example, if after this first clock cycle the comparison indicates that $V_{IN1}$ is less than $V_{OUT1}$, then it is concluded by SAR 28 that the digital word corresponding to $V_{IN1}$ should be lower than 1000. Returning now to the example of an analog input corresponding to a value of 1011, however, the first clock cycle results in a determination that the ultimate output exceeds 1000. Accordingly, at this point SAR 28 maintains a record that the MSB should be set to 1, thereby ensuring that the ultimate value Of $V_{OUT1}$ as may be sampled from bus 32 is equal to or greater than 1000 as appreciated from the remaining discussion of FIG. 2.

Following the above, a second clock cycle is asserted to SAR 28, and SAR 28 responds by repeating the preceding steps but here with respect to the next lesser significant bit of its four bit analysis and also in view of what already has been determined with respect to the MSB. Specifically, and continuing with the present example, in response to the second clock assertion SAR 28 again outputs a 4-bit address on bus 32, with the MSB set to the value recorded from the first clock (i.e., 1 in the current example). In addition, SAR 28 sets the next lesser significant bit (i.e., $I_2$) to a logic high and again leaves the remaining LSBs set to low. Thus, for this second clock assertion a digital value of 1100 is placed on bus 32 and thereby input to DAC 10. In response, DAC 10 outputs a corresponding analog voltage $V_{OUT1}$ to comparator 24, which therefore compares $V_{OUT1}$ With $V_{IN1}$ (i.e., the analog voltage being converted) and feeds back the comparison result to SAR 28. Recall that in the current example, the ultimate digital output is 1011. Accordingly, for this second clock cycle the comparison indicates that $V_{IN1}$ is lower than $V_{OUT1}$ because comparator 24 is comparing an analog voltage $V_{IN1}$ having a magnitude corresponding to a value of 1011 to an analog voltage $V_{OUT1}$ having a magnitude, as provided by DAC 10, corresponding to a value of 1100. In response to the negative output of comparator 24, it is concluded by SAR 28 that the digital output word corresponding to $V_{IN1}$ should be lower than the current word on bus 32, that is, the ultimate value of $V_{OUTD1}$ is less than 1100. Accordingly, at this point SAR 28 maintains a record that the MSB should be set to 1, and the next lesser significant bit should be set to 0, thereby ensuring that the ultimate value of $V_{OUTD1}$, as may be sampled from bus 32, will have its two MSBs equal to or greater than 10.

Continuing with the third clock cycle asserted to SAR 28, SAR 28 again repeats the above, now with respect to the next lesser significant bit of the four bits and, hence, with respect to bit $I_1$. Continuing again with the present example, in response to the third clock assertion SAR 28 again outputs a 4-bit address on bus 32, with the two most MSBs set to the values recorded from the first and second clock (i.e., 10 in the current example). In addition, SAR 28 sets the next lesser significant bit (i.e., $I_1$) to a logic high and again leaves the least significant bit set to zero. Thus, for this third clock assertion a digital value of 1010 is placed on bus 32 and thereby input to DAC 10. In response, DAC 10 outputs a corresponding analog voltage $V_{OUT1}$ to comparator 24, which therefore compares $V_{OUT1}$ with $V_{IN1}$ and feeds back the comparison result to SAR 28. Recall that in the current example, the analog input $V_{IN1}$ corresponds to 1011. Accordingly, for this third clock cycle the comparison indicates that $V_{IN1}$ is greater than $V_{OUT1}$. In response to the positive output of comparator 24, it is concluded by SAR 28 that the digital output word corresponding to $V_{IN1}$ should be higher than the current word on bus 32, that is, the ultimate value of $V_{OUTD1}$ is greater than 1010. Accordingly, at this point SAR 28 maintains a record that the three MSBs should be set to 101, thereby ensuring that the ultimate value of $V_{OUTD1}$ as may be sampled from bus 32 is equal to or greater than 1010.

The fourth and final clock cycle asserted to SAR 28 completes the LSB of the 4-bit output of ADC 20 by repeating steps comparable to the above. Thus, with respect to bit $I_0$ and in response to the fourth clock assertion SAR 28 again outputs a 4-bit address on bus 32, with the three most MSBs set to the values recorded from the first through third clock cycles (i.e., 101 in the current example). In addition, SAR 28 sets the next lesser significant bit (i.e., $I_0$) to a logic high. Thus, for this fourth clock assertion a digital value of 1011 is placed on bus 32 and thereby input to DAC 10. In response, DAC 10 outputs a corresponding analog voltage $V_{OUT1}$ to comparator 24, which therefore compares $V_{OUT1}$ with $V_{IN1}$ (i.e., the analog voltage being converted) and feeds back the comparison result to SAR 28. Recall that in the current example, the ultimate digital output is 1011. Accordingly, for this fourth clock cycle the comparison indicates either that $V_{IN1}$ equals $V_{OUT1}$ or, in a more likely statistical case, that $V_{IN1}$ slightly exceeds $V_{OUT1}$. In response to the positive output of comparator 24 with respect to this final bit, it is concluded by SAR 28 that the digital output word corresponding to $V_{IN1}$ is that which is currently being input on address bus 32 to DAC 10. Accordingly, at this point the address of 1011 on bus 32 is available for sampling at output $V_{OUTD1}$ of ADC 20 and as such represents the final converted value for the current example. Lastly, it should be noted with respect to the final bit that if the comparison were such that the value $V_{OUT1}$ from DAC 10 were lower than $V_{IN1}$, then SAR 28 sets the value of $I_0$ to 0 and outputs that newly adjusted address to bus 32, in which case for the current example a converted value of 1010 would have been output as the final digital conversion.

While ADC 20 of FIG. 2 has provided useful in various configurations, the present inventors have recognized various of its drawbacks where such drawbacks may render an alternative embodiment more desirable in certain instances. For example, as stated by introduction and shown through the preceding example, to perform its conversion ADC 20 requires a number of clock cycles equal to the number of output bits. For larger ADCs, therefore, the number of clock cycles is correspondingly large. In addition, this limitation is combined with the use of a resistor string 12 which may be slower than other implementations due to the time required by decoders 14 and 16 as well as any resistive/capacitive delay introduced by the overall circuit configuration.

By way of further background, an alternative ADC configuration is known in the art which is sufficiently simple in construction to describe without illustration. In the alternative, again a resistor string is implemented whereby each tap along the string corresponds to a different analog voltage. Each tap is connected to a first input of a corresponding comparator, while the second input of each comparator is connected to receive the to-be-converted analog voltage. Thus, when the analog input voltage is input to the ADC, in a single instance, sometimes referred to as a flash, the voltage is compared by the numerous comparators to each tap voltage. At some point along the successive comparators, the output of one comparator will differ from the output of the next successive comparator. Thus, the input voltage is between the tap voltages corresponding to these two different comparators, and this location is then encoded to present a digital value corresponding to this location. While this alternative operates as a flash device, the present inventors also have recognized many of its drawbacks. For example, the number of comparators increases exponentially with the bit size of the ADC, that is, it equals the number of taps in the string. For example, an 8-bit ADC of this type may select among 256 different voltages and, thus, requires at least 256 comparators. As another example of a drawback, for each of these comparators, they will require strict offset limitations to ensure that the comparator offset is considerably less than the difference between tap voltages. This requirement increases both device complexity and cost, and may be particularly troublesome where a large number of comparators are required. As still another example, a total flash architecture requires that the input voltage drive an input capacitance of all of the comparators in parallel. Thus, in the 8-bit ADC with 256 comparators, the input voltage must drive the capacitance of all of these comparators. This level of capacitance is relatively large, and may be quite a burden on a high speed pin.

In view of these preceding embodiments and drawbacks as well as others ascertainable by one skilled in the art, there arises a need to provide an improved ADC as is achieved by the preferred embodiments discussed below.

BRIEF SUMMARY OF THE INVENTION

In one embodiment, there is an analog-to-digital converter ("ADC") comprising an input for receiving an input analog voltage. The ADC further comprises a digital-to-analog circuit, comprising a meandering string of series connected resistive elements having a plurality of voltage taps, as well as a number of bit lines and a number of word lines. For a given input analog voltage, the given input analog voltage is closest to a voltage at a selected one of the plurality of taps. In addition, the selected one of the plurality of taps is associated with one of the number of bit lines and one of the number of word lines. Additionally, the ADC further comprises a flash circuit coupled to receive the input analog voltage from the input and in response to identify either the one of the number of bit lines or the one of the number of word lines. Lastly, the ADC comprises an output for providing a digital output value in part in response to the identified one of the number of bit lines or the one of the number of word lines. Other circuits, systems, and methods are also disclosed and claimed.

DETAILED DESCRIPTION OF THE INVENTION

Figure 1:
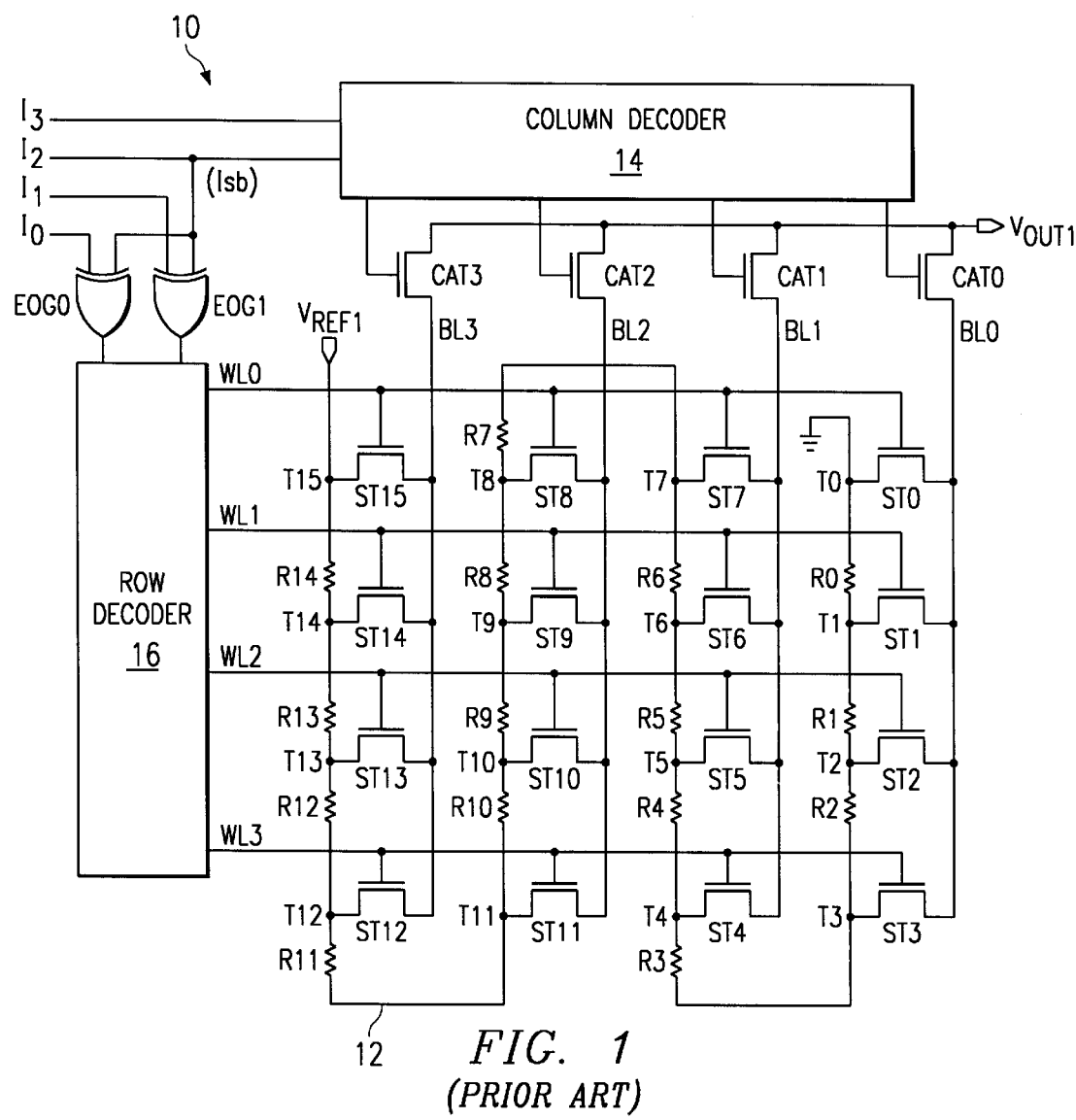
FIG. 1 illustrates a schematic of a prior art digital-to-analog converter ("DAC")
Figure 2:
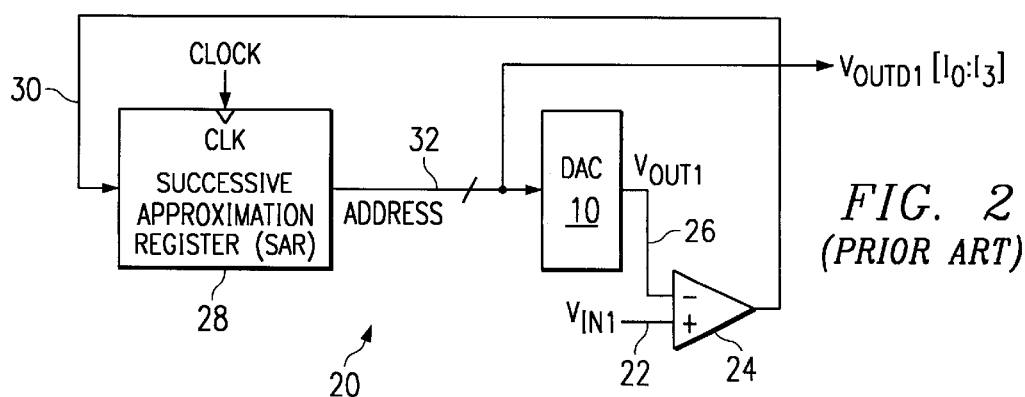
FIG. 2 illustrates a schematic of a prior art analog-to-digital converter ("ADC") using the DAC of FIG. 1.

FIGS. 1 and 2 were described in the preceding Background Of The Invention section of this document and in connection with the prior art.

Figure 3:
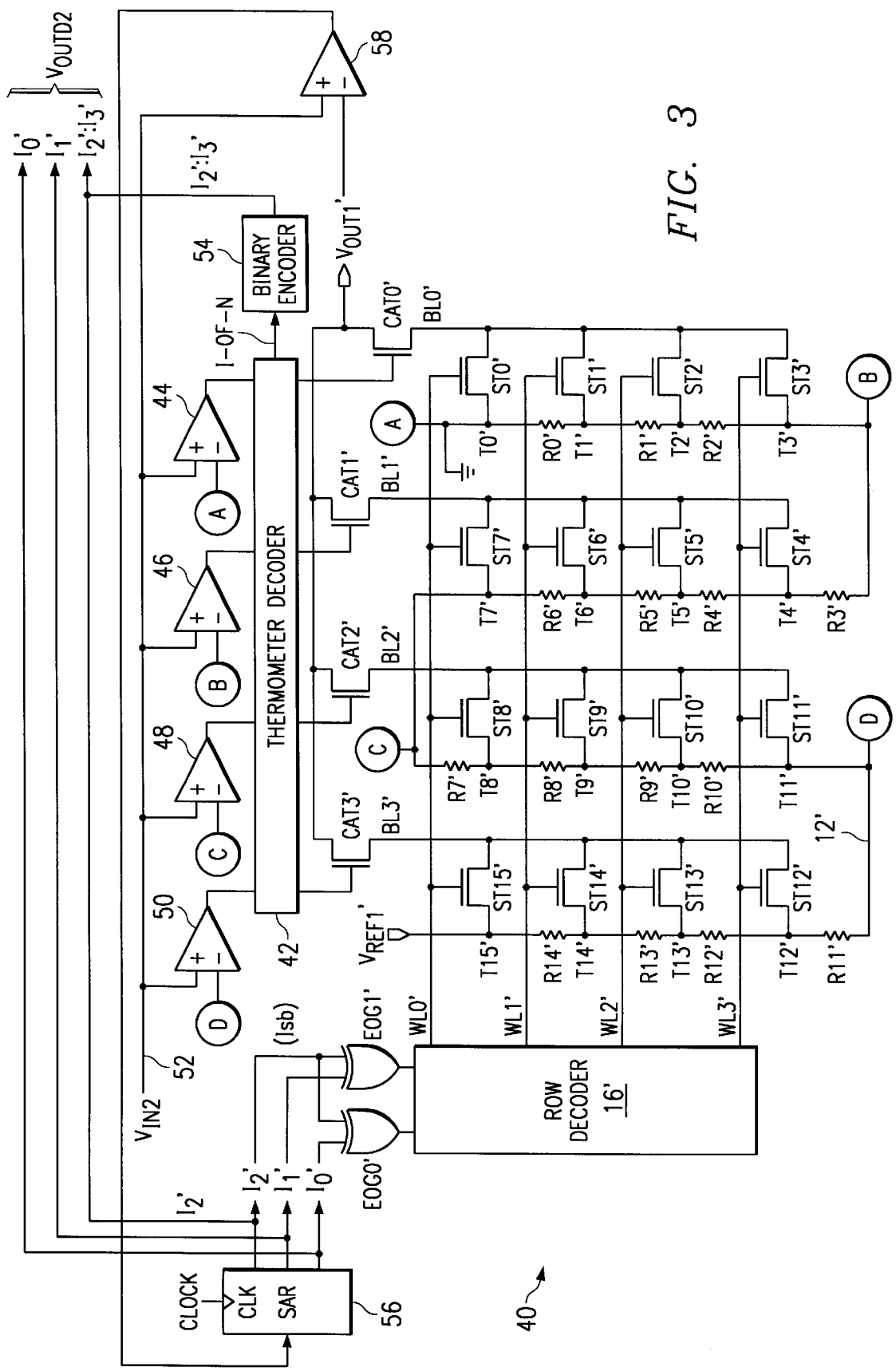
FIG. 3 illustrates a schematic of a first inventive ADC including a group of comparators and a thermometer decoder to perform a flash determination of the upper half of the output bits in the digital conversion.

FIG. 3 illustrates a schematic of an analog-to-digital converter ("ADC") 40 according to a first inventive embodiment and, that, for purposes of comparison with the prior art described above, converts an analog input signal $V_{IN2}$ equal to or greater than ground, to a 4-bit digital output value $V_{OUTD2}$. ADC 40 includes various components that are comparable in connection and operation to components in DAC 10 of FIG. 1. To illustrate these like components, they are shown with the same reference identifiers as in FIG. 1, with the exception that an apostrophe is added to the identifier in FIG. 3. Briefly reviewing these comparable elements, and assuming the reader is familiar with DAC 10, ADC 40 includes a DAC structure having a series-connected resistor string 12' in the form of a meander having fifteen resistive elements R0' through R14', formed by one of various techniques such as those known in the art and with an effort to ensure like resistance for each element. The ends of the resistive elements give rise to an array of corresponding taps T0' through T15', biased in total by a reference voltage $V_{REF1}$' and, thus, divided evenly across the taps of string 12'. The DAC structure of ADC 40 is arranged in a symmetric array format and thereby includes a number of bit lines BL0' through BL3' as well as a same number of word lines WL0' through WL3'. Each bit line is accessed by enabling a corresponding one of column access transistors CAT0' through CAT3'. More specifically and as detailed additionally below, electrical access to a given tap voltage is achieved by row decoder 16' asserting a word line to enable its corresponding switching transistors while concurrently asserting an enabling signal to a gate of one of the column access transistors such that the tap voltage conducts through a switching transistor to a bit line, and then through the enabled column access transistor to an output $V_{OUT1}$'. As also detailed below for the present embodiment, after a bit line is identified the voltage at $V_{OUT1}$' is used to perform a binary search to converge on the lower half of bits in the ultimate digital output value $V_{OUT1}$'.

The various items of contrast between ADC 40 and DAC 10 pertain in part to the operation of the DAC configuration, and further relate to the analog conversion functionality provided by ADC 40. Looking to the structure corresponding to these contrasting functions, a thermometer decoder 42 provides a 1-of-N code that is coupled to drive the gates of column access transistors CAT0' through CAT3'. More particularly and as detailed later, thermometer decoder 42 provides the 1-of-N code in response to a thermometer code assembled from the outputs of four successive comparators 44, 46, 48, and 50, where each of those comparators has its non-inverting input coupled to an input 52 that receives the analog input voltage $V_{IN2}$. The inverting inputs of comparators 44, 46, 48, and 50 are coupled to various respective nodes along string 12', and to simplify the schematic illustration these connections are shown with encircled capital letters. More specifically, the inverting input of comparator 44 is connected to node A, the inverting input of comparator 46 is connected to node B, the inverting input of comparator 48 is connected to node C, and the inverting input of comparator 50 is connected to node D. The locations of nodes A through D as shown are preferred, but alternative locations may be selected by one skilled in the art. The 1-of-N code from thermometer decoder 42 is also coupled to a binary encoder 54 which, as discussed later, converts the code into a 2-bit output representing the two most significant bits $I_2$' and $I_3$' of the digital conversion. Ultimately, therefore, these bits may be sampled when completing the conversion process. In addition, during the conversion, bit $I_2$' is fed back to exclusive OR gates EOG0' and EOG1' as a first input. The second input of each of exclusive OR gates EOG0' and EOG1' is connected to receive a corresponding bit from the output of a clocked successive approximation register ("SAR") 56. SAR 56 may be constructed according to one skilled in the art given the functionality and connections detailed in this document. As to those connections, the input of SAR 56 is connected to an output of a comparator 58 which, for reasons detailed later, preferably has a considerably lower susceptibility to offset as compared to comparators 44 through 50; for example, in the preferred embodiment comparator 58 may include some type of offset mechanism, where such a mechanism may not be necessary for comparators 44 through 50. Lastly, note that bits $I_1$' and $I_0$' as output by SAR 56 ultimately combine with bits $I_3$' and $I_2$' from binary encoder 54 to form the final converted digital value, $V_{OUTD2}$.

The operation of ADC 40 is as follows and is also shown by way of a flow chart method 60 shown in FIG. 4. By way of introduction, method 60 demonstrates the conversion of the input analog signal $V_{IN2}$ to the digital output signal $V_{OUTD2}$, where $V_{OUTD2}$ is by way of example a 4-bit digital value having bits $I_0$' through $I_3$'. In general, ADC 40 accomplishes the conversion by comparing $V_{IN2}$ to selected tap voltages from the array of its DAC structure and converging on a voltage tap with a voltage closest to and greater than $V_{IN}$, where the final digital output $V_{OUTD2}$ (i.e., bits $I_0$':$I_3$') corresponds to the address of that voltage tap. In the preferred embodiment, this conversion is a two step methodology. The first step of the method, in a single instance, identifies/selects one of the four bit lines, where the selected bit line corresponds to the voltage tap having the voltage that is closest to and above the value of $V_{IN2}$. The second step of the method, in successive clock cycles, determines the address of the word lines corresponding to the voltage tap having the voltage that is closest to and above the value of $V_{IN2}$. Each of these two steps is discussed in greater detail below. Lastly, to facilitate the remaining discussion of ADC 40, an example of its operation is examined where an input voltage $V_{IN2}$ is closest to and below the voltage at tap T9'. Given the introductory statement of operation, one skilled in the art should therefore expect that the output of ADC 40 will provide a digital value of $V_{OUTD2}$ equal to 1001 (i.e., binary nine), and that expectation is confirmed below.

The first step of operation of DAC 40 is broken down within method 60 into four blocks 62, 64, 66, and 68; while four separate blocks are shown, however, it is noted that the combined operation of these blocks preferably occurs within a single clock cycle, but in this instance the clock is not applied to SAR 56. Each of these blocks is discussed in detail below.

In block 62 of the first step, $V_{IN2}$ is coupled to input 52 and thereby applied to the non-inverting inputs of each of comparators 44, 46, 48, and 50. Accordingly, each of comparators 44, 46, 48, and 50 in a single instance or "flash" compares $V_{IN2}$ to the voltage at their inverting inputs. For example, comparator 44 compares $V_{IN2}$ to the voltage at node A, and that voltage equals ground. As another example, comparator 44 compares $V_{IN2}$ to the voltage at node B, and that voltage equals the voltage at tap T3' (i.e., $3/15 * V_{REF1}$'). Comparators 46 and 48 also operate in a like manner. For each comparator, its output is high if the voltage connected to its non-inverting input exceeds the voltage connected to its inverting input and, conversely, is low if the voltage connected to its non-inverting input does not exceed the voltage connected to its inverting input. Moreover, by concatenating the flash comparison outputs of comparators 46 through 50, four bits are provided which form a thermometer pattern. A thermometer pattern is generally known in some art, and below is a discussion of such a pattern to further facilitate the remaining discussion.

A thermometer pattern is a pattern ranging from all binary ones to all binary zeros, where for patterns having both ones and zeroes one or more successive bits starting at one end of the pattern are zeroes and the remaining bit(s) of the pattern is/are ones. To further illustrate such patterns, Table 1 immediately below illustrates the possible thermometer patterns provided by comparators 44 through 50, where each is labeled with a pattern number for purposes of later discussion.

TABLE 1

| Pattern Number | Comparator 50 output | Comparator 48 output | Comparator 46 output | Comparator 44 output |
|---|---|---|---|---|
| 1 | 0 | 0 | 0 | 0 |
| 2 | 0 | 0 | 0 | 1 |
| 3 | 0 | 0 | 1 | 1 |
| 4 | 0 | 1 | 1 | 1 |
| 5 | 1 | 1 | 1 | 1 |

Various observations are noteworthy with respect to Table 1. As one observation, the preceding definition of a thermometer pattern may be confirmed by viewing the output of comparator 44 as a least significant bit of the pattern and comparator 50 as a most significant bit of the pattern. As another observation, while Table 1 illustrates five possible thermometer patterns, it is most likely that pattern 1 will not occur in the operation of ADC 40 due to the connection of node A to the non-inverting input of comparator 44. Specifically, since node A is connected to ground, and assuming as was noted earlier that $V_{IN2}$ is between ground and some higher potential, then by definition $V_{IN2}$ will exceed the voltage at the non-inverting input of comparator 44 and, hence, pattern 1 of Table 1 should not occur. Nonetheless, it is included in the Table to illustrate thermometer patterns in general and also due to offset possibilities discussed later.

Having further analyzed thermometer patterns, the discussion now returns to the first step of method 60, with the flow turning to block 64. Moreover, recall that it was earlier introduced as an example that $V_{IN2}$ is a voltage that is closest and below that at tap T9'. As a result, one skilled in the art will confirm that by comparing this voltage to the inverting inputs of comparators 44 through 50, a thermometer pattern of 0111 (i.e., pattern 4) is produced. In block 64, the thermometer pattern is coupled by the outputs of comparators 44 through 50 to thermometer decoder 42.

In block 66, thermometer decoder 42 responds to the thermometer pattern by producing a corresponding binary sequence referred to herein as a 1-of-N code. More particularly, thermometer decoder 42 includes circuitry, as may be implemented by one skilled in the art, to identify the location within the thermometer pattern representing the change between the succession of binary ones and zeroes, or to identify whether such a change occurs. One such implementation includes a plurality of AND gates, each coupled to receive a pair of successive bits in the thermometer pattern, with the more significant of the successive bits inverted prior to being input to the AND gate; this configuration, therefore, produces a logic 0 if the two successive bits in the thermometer pattern are the same and a logic 1 if those bits differ. As a result, only the one AND gate receiving two different successive thermometer pattern bits outputs a logic 1 and, thus, only one at most of the N bits in this code equals a binary 1. Further, the location of this AND gate identifies the location where the thermometer pattern changes from zeroes to ones. In other words, in the preferred embodiment, this determination is represented by a 1-of-N code having the same number of bits as in the thermometer pattern and with only one bit in an asserted state (e.g., logic one), where the location of the asserted bit corresponds to the most significant location in the thermometer pattern before a state change (e.g., from 1 to 0) occurs. For example, for pattern in Table 1, thermometer decoder 42 determines that there is no change in the binary values in the pattern and outputs all zeroes (i.e., a 1-of-N code equal to 0000). For the current example of pattern 4 in Table 1, thermometer decoder 42 determines that a change in the bit values occurs in the pattern after the three least significant bits and, thus, decoder 42 outputs a decoder binary sequence having a logic located at the third bit location (i.e., a 1-of-N code equal to 0100).

In block 68, the binary sequence from thermometer decoder 42 is coupled from least significant bit to most significant bit to the gates of column access transistors CAT0' through CAT3', respectively, and also to binary encoder 54. Looking first to the effect on column access transistors CAT0' through CAT3', and recalling the present example where $V_{IN2}$ is closest to and below the voltage at tap T9', for a 1-of-N code of 0100 the gate of column access transistor CAT2' receives an enabling potential while the other column access transistors are not enabled. In other words, the 1-of-N code from thermometer decoder 42 is used to identify/select the one bit line that includes the tap having a voltage closest to $V_{IN2}$. Looking now to the effect of coupling the 1-of-N code to binary encoder 54, binary encoder 54 converts the binary sequence into a 2-bit output equal to the bit position, if any, that is of unique state (e.g., the bit position that is set in the 1-of-N code). Moreover, this converted value represents the two most significant bits $I_2'$ and $I_3'$ of the digital conversion, that is, these two bits correspond to the identified/selected bit line. For example, considering the 1-of-N code corresponding to tap T9', recall it equals 0100. Accordingly, binary encoder 54 produces a 2-bit output equal to binary two (i.e., 10) because the unique bit is in bit position two of that code. Since this value is provided as bits $I_3'$ and $I_2'$, then at the conclusion of the first step of operation of ADC 40, the upper half of the output bits have been determined. This action completes the first step of the methodology of operation for ADC 40.

From the above, one skilled in the art should appreciate that in a single clock cycle, the following occurs: (1) the voltage at $V_{IN2}$ is sampled by comparators 44 through 50; (2) comparators 44 through 50 provide a thermometer pattern to thermometer decoder 42; (3) thermometer decoder 42 provides a 1-of-N code with at most one logic one; and (4) the 1-of-N code identifies/selects one of bit lines BL0' through BL3' by enabling its corresponding column access transistor and is encoded by binary encoder 54 to produce the upper half of digital bits to form the ultimate output $V_{OUTD2}$. This may now be contrasted to the prior art, such as described with respect to FIGS. 1 and 2. Specifically, recall that for the prior art, a number of clock cycles equal to half the number of output bits was required to correspondingly select a bit line. Consequently, the preferred embodiment achieves a comparable result using one clock cycle. Indeed, the preceding examples have shown a relatively small decoder having an output of only four bits (and, hence, a DAC with only four bit lines); in a more complex example, however, the DAC is likely to have a much larger number of bit lines. In such a case, the preferred embodiment may be implemented whereby one of those bit lines may be selected in a single clock cycle rather than requiring a number of clock cycles equal to half the number of bits corresponding to the larger converter.

The second step of operation of ADC 40 occurs over numerous clock cycles to converge on the appropriate word line corresponding to $V_{IN2}$, and is comparable in various respects to the operation of the prior art. Accordingly, assuming the reader is familiar with the previous discussion of the prior art, a review of the comparable aspects to ADC 40 is provided below, and is shown as blocks 70 through 82.

In block 70, a clock signal is applied to SAR 56. Thus, for the first instance of block 70, this clock signal may be thought of as a second clock signal following the first clock signal of blocks 62 through 68 during which a bit line was identified/selected within the DAC structure of ADC 40. As appreciated from the remaining discussion, the second clock cycle commences a sequence of operations of SAR 56 whereby, for each successive clock cycle, SAR 56 performs a binary search routine in view of the feedback it receives from comparator 58. Here, the clock cycles and binary search routine continue until the word line corresponding to the tap voltage closest to $V_{IN2}$ is selected among the word lines of the DAC structure of ADC 40; thus, in the current example, the search continues until a word line is selected among word lines WL0' through WL3', as further appreciated from the following.

Each clock operation of SAR 56 effects a binary search routine by causing SAR 56 to issue an address that is directed to a different bit of the lower half of bits in the total output value of $V_{OUTD2}$, thereby issuing successive addresses to converge on a word line in the DAC configuration. Thus, for the first instance of block 70, the most significant bit of the lower half of output bits is set. For the present example of a 4-bit output $I_0'$–$I_3'$, therefore, the lower half of bits is bits $I_1'$ and $I_1'$, and bit $I_1'$ is the most significant of those bits so it is set in the 2-bit output of SAR 56. To further appreciate this operation, the example of a value of $V_{IN2}$ converted to tap T9' is now traced in greater detail. First, recall that in the first step of operation, bits $I_3'$ and $I_2'$ were found to equal a binary value of 10. Next, in block 70, and in response to the second clock cycle, SAR 56 outputs a 2-bit address corresponding to values for bits $I_1'$ and $I_0'$, with the most significant of those bits (i.e., bit $I_1'$) set to a logic high and leaving the remaining LSB(s) (i.e., bit $I_0'$) cleared to low. Thus, for this second clock assertion a digital value of 10 is output by SAR 56.

In block 72, the 2-bit address from SAR 56 is applied to row decoder 16' to output a voltage $V_{OUT1}'$ in response to the selection of a word line, where that output also may be affected due to gates EOG0' and EOG1'. Specifically, in addition to the 2-bit address from SAR 56, note that the value of bit $I_2'$ as earlier determined in the first clock cycle is fed back to both gates EOG0' and EOG1'. Continuing with the example corresponding to tap T9', recall that $I_2'$ equals 0. Thus, from block 70 these three bits 010 are input to row decoder 16'. More particularly, since $I_2'$ equals 0, gates EOG0' and EOG1' pass the values of $I_1'$ and $I_0'$, equal to 10, respectively, directly to row decoder 16'. In response, in block 72 row decoder 16' identifies/asserts the word line corresponding to the binary input of 10, that is, word line WL2'; moreover, since bit line BL2' is currently selected due to the operation in the first clock cycle, then the voltage at tap T10' is output to $V_{OUT1}'$.

In block 74, the value of $V_{OUT1}'$ is input to comparator 58 which compares $V_{IN2}$ (i.e., the analog voltage being converted) with $V_{OUT1}'$. If $V_{IN2}$ is less than $V_{OUT1}'$, then method 60 continues to block 76. If $V_{IN2}$ is greater than $V_{OUT1}'$, then method 60 continues to block 78.

Block 76, having been reached because $V_{IN2}$ is less than $V_{OUT1}'$, indicates to SAR 56 that the tap voltage closest to $V_{IN2}$ has an address lower than that currently being provided by SAR 56. By way of example, recall that in the current instance the ultimate digital output is 1001 for tap T9'. Accordingly, block 74 determines that $V_{IN2}$ is currently less than $V_{OUT1}'$ because comparator 58 is comparing an analog voltage $V_{IN2}$ having a magnitude corresponding to a value of 1001 to an analog voltage $V_{OUT1}'$ having a magnitude, as provided by the DAC, corresponding to a value of 1010. In response to the negative output of comparator 58, it is concluded by SAR 56 that the digital output word corresponding to $V_{IN2}$ should be lower than the current bits output as $I_1'$ and $I_0'$, that is, the ultimate value of $V_{OUTD2}$ is less than 1010. Accordingly, at this point SAR 56 maintains a record that the MSB of the lower half of bits (i.e., bits $I_0'$ and $I_1'$ of the bits $I_0'$ through $I_3'$) should be cleared to a value of 0, thereby ensuring that the ultimate value of $V_{OUTD2}$ is equal to or less than 1010 as appreciated from the remaining discussion of FIG. 3.

Block 78, having been reached because $V_{IN2}$ is greater than $V_{OUT1}'$, indicates to SAR 56 that the tap voltage closest to and above $V_{IN2}$ has an address equal to or greater than that currently being provided by SAR 56. Thus, it is concluded by SAR 56 that the digital output word corresponding to $V_{IN2}$ should be equal to or greater than the current bits output as $I_1'$ and $I_0'$ and SAR 56 maintains a record that the MSB of the lower half of bits (i.e., bits $I_0'$ and $I_1'$ of the bits $I_0'$ through $I_3'$) should be maintained at a value of 1.

Block 80 determines whether there are remaining bits in the lower half of the output bits of $V_{OUTD2}$ that have not yet been determined. If so, method 60 returns to block 70 for another clock cycle. If all the bits have been determined, then method 60 concludes with block 82, described after the completion of the current example which returns the flow to block 70.

Completing the present example, when block 80 is first reached then bit $I_0'$ remains undetermined. Thus, the flow returns to block 70 where a third clock cycle is asserted to SAR 56. SAR 56 responds by repeating the preceding steps but here with respect to the next lesser significant bit of its two bit analysis and also in view of what already has been determined with respect to the most significant bit of its two bit analysis. Specifically, and continuing with the present example, in response to the third clock assertion SAR 56 again outputs a 2-bit address, with the most significant of those two bits set to the value recorded from the first clock (i.e., 0 in the current example). In addition, SAR 56 sets the next lesser significant bit (i.e., $I_0'$) to a logic high. Thus, for this third clock assertion a digital value of 01 is output by SAR 56. Next in block 72 a new value of $V_{OUT1}'$ is output when the DAC configuration selects word line WL1' which, when combined with the already-selected bit line BL2', operates to output the voltage from tap T9' as the corresponding analog voltage $V_{OUT1}'$ to comparator 58. In step 74, comparator 58 compares $V_{OUT1}'$ with $V_{IN2}$ and feeds back the comparison result to SAR 56. Recall that in the current example, the ultimate digital output is 1001. Accordingly, for this third clock cycle the comparison indicates that $V_{IN2}$ is slightly greater or within some tolerance of $V_{OUT1}'$ because comparator 58 is comparing an analog voltage $V_{IN2}$ having a magnitude corresponding to a value of 1001 to an analog voltage $V_{OUT1}'$ having a magnitude, as provided by the DAC, corresponding to a value of 1001. In response to the output of comparator 58, it is concluded by SAR 56 that the current 2-bit address is accurate and should not therefore be changed, as reflected in FIG. 4 by moving to block 80. Here, block 80 concludes that all of the lower half of output bits have been determined, and method 60 concludes with block 82.

As of block 82, the 2-bit address from SAR 56 represents the final converted output values for bits $l_0'$ and $I_1'$.

Accordingly, block 82 combines those bits with the earlier flash determined values of bits $I_2'$ and $I_3'$ from binary encoder 54 to form the ultimate output word $V_{OUTD2}$.

Having described the operation of ADC 40 in one embodiment, note that the preceding may be modified further given the relative offset sensitivity of comparator 58 versus that of comparators 44 through 50. More specifically, recall it was noted earlier that comparator 58 preferably has a considerably lower susceptibility to offset as compared to comparators 44 through 50. Given the added immunity to offset, an alternative methodology is within the present inventive scope as detailed later. By way of introduction and to appreciate this operation, first assume an example where $V_{IN2}$ equals an analog voltage just below the voltage at tap T8'. Accordingly, under proper operation of method 60, then after the first clock cycle thermometer decoder 42 enables column access transistor CAT2' since it connects to the bit line (i.e., BL2') to which the desired tap T8' is connected. However, offset considerations may cause this proper operation to not occur, as is further detailed immediately below.

To further appreciate the possible effects of offset, consider again the example where $V_{IN2}$ corresponds to tap T8'. Next, assume that the voltage difference between each successive pair of taps in ADC 40 is 1 millivolt and that comparators 44 through 50 each have an offset of ±0.5 millivolt. Given these numbers, one skilled in the art will appreciate that the offset is sufficiently large such that the comparisons made by comparators 44 through 50 could cause comparator 48 to inaccurately indicate that $V_{IN2}$ is less than the voltage at node C, and in response therefore thermometer decoder 42 would select bit line BL1' rather than BL2'. Given this possibility, one alternative approach is to reduce the offset sensitivity of comparators 44 through 50, but of course such an alternative increases the device complexity and cost. Accordingly, FIG. 5 below illustrates a further modification within the present inventive scope.

Figure 4:
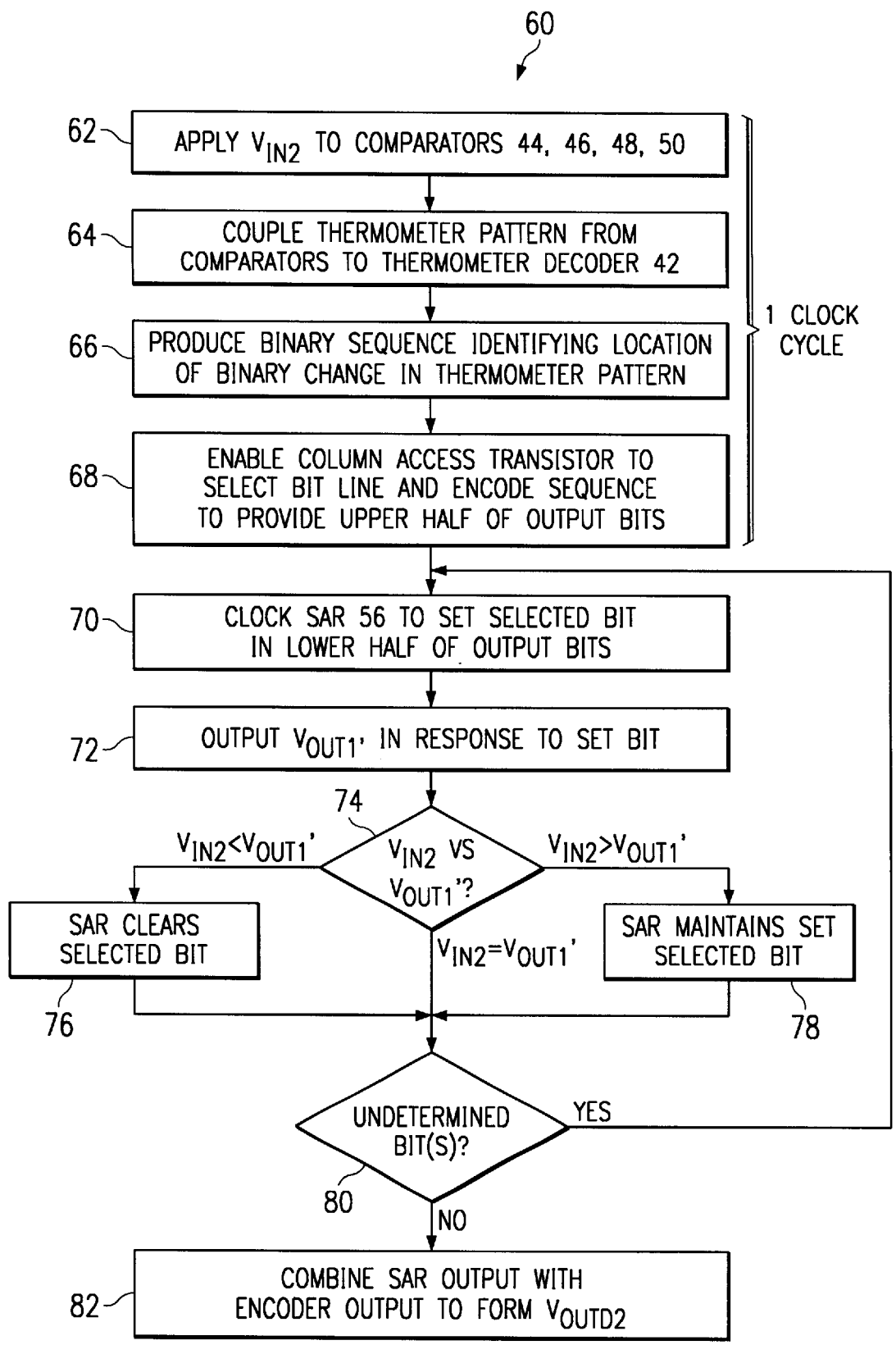
FIG. 4 illustrates a flow chart of the method of operation of the ADC of FIG. 3.

FIG. 5 once again illustrates method 60 of FIG. 4, but some additional blocks are added thereto in view of the offset considerations set forth above. Particularly, between blocks 66 and block 68 are added blocks 84 and 86, each of which is described below.

To appreciate block 84, recall that block 66 preceding it produces a 1-of-N code that has a single set bit corresponding to the location of the most significant comparator among comparators 44 through 50 that is outputting a logic 1. For the example where comparator 48 erroneously determines that $V_{IN2}$ is less than its reference voltage at node C and hence outputs a logic 0, the thermometer pattern is 0011 and the 1-of-N code equals 0010. In view of these actions, in block 84 the reference voltage for the comparator that is the next higher in significance over the set bit in the 1-of-N code is output to $V_{OUT1}'$. For example, in the present case of a 1-of-N code of 0010, the set bit corresponds to comparator 46 and, thus, the next higher significant comparator is comparator 48, having its reference voltage equal to node C. Thus, a sufficient address is applied to row decoder 16 and the column access transistor to cause the voltage at node C (i.e., tap T7') to be output as $V_{OUT1}'$ to comparator 58.

Next, in block 86, comparator 58 compares the reference voltage from $V_{OUT1}'$ to $V_{IN2}$. In other words, comparator 58 is now used to confirm the result provided by the comparator which is the next significant over that comparator producing the most significant binary 1 in the thermometer pattern. As a result, the relatively enhanced offset capability of comparator 58 is used to confirm the result reached by the relatively lower offset capability comparator, which here is comparator 48. If the results of the comparisons match, therefore, method 60 continues to step 68 and proceeds as discussed above. If a mis-match occurs, however, a corrective action is taken as may be determined by one skilled in the art, such as substituting the result of the comparison from comparator 58 for that of the comparator to which it is being compared. Lastly, note that the additional actions taken by blocks 84 and 86 require an additional clock cycle of operation over method 60 as shown in FIG. 3, but provide as a tradeoff the ability to have lower offset capabilities in comparators 44 through 50.

The preceding discussion of using comparator 58 to confirm the results of one of the comparators 44 through 50 may be extended further for a larger device, that is, one with many more bit lines and many more comparators of the type used in FIG. 3 for the successive comparators 44 through 50. For example, suppose in an alternative configuration the DAC configuration included 32 bit lines and, hence, 32 successive comparators of the same type as comparators 44 through 50. In this type of configuration, a further modification contemplated within the present inventive scope is to use the enhanced offset sensitivity of comparator 58 to confirm the result of multiple ones of the less complex comparators. For example, in three separate instances comparator 58 could be used to confirm the outputs of three different ones of the less complex comparators, where those three comparators preferably include the one comparator outputting the most significant located logic 1 in the thermometer pattern, as well as the comparator immediately preceding and immediately following it in the succession of comparators. In this manner up to three additional clock cycles might be required, but at this expense would be the greater accuracy provided by confirming the first flash comparison using the greater offset immunity of comparator 58.

Figure 5:
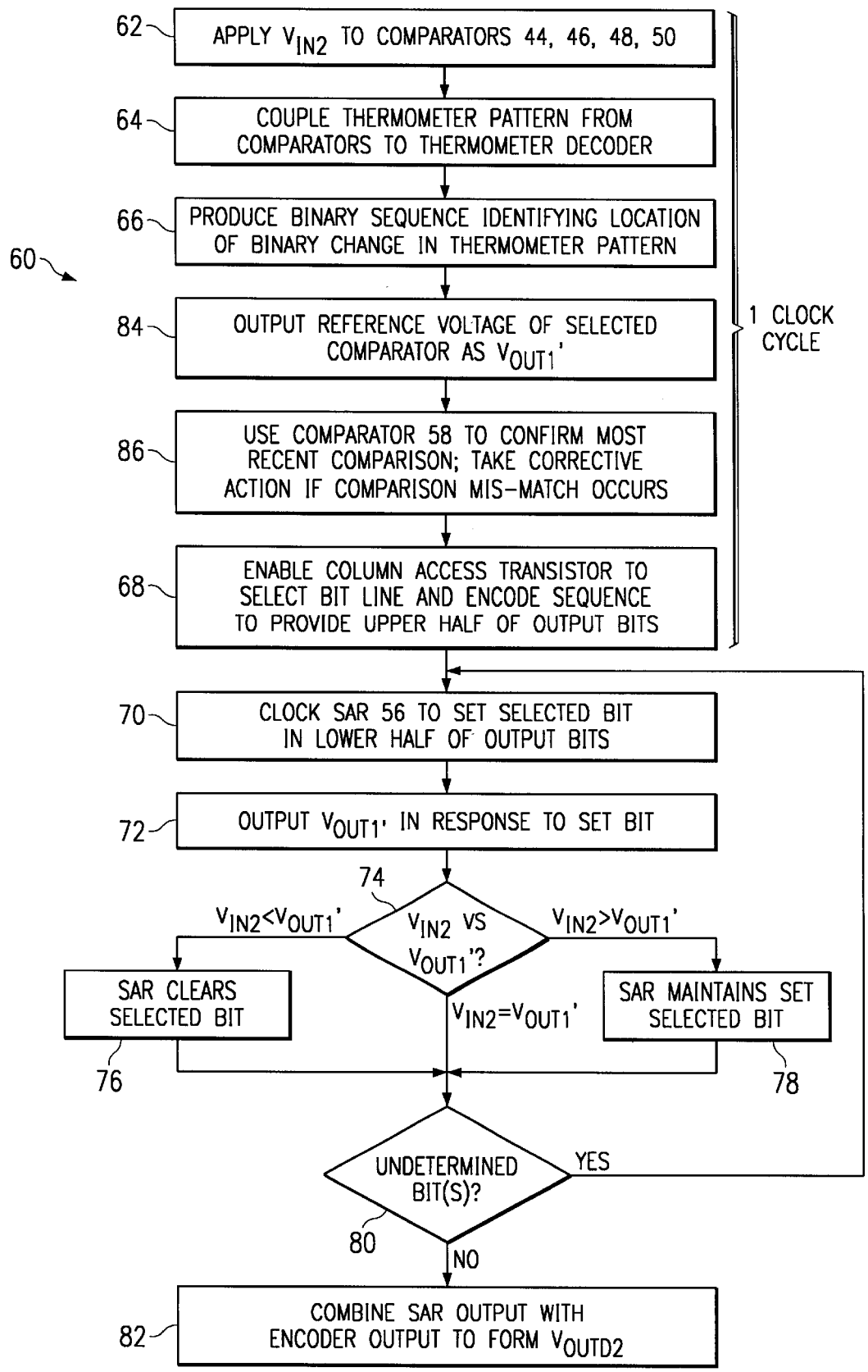
FIG. 5 illustrates a modification of the flow chart of FIG. 4, thereby providing an alternative method of operation whereby the single comparator having a lower offset susceptibility is used to confirm the determination of a more offset-susceptible comparator.

From the above, it should now be appreciated that the embodiments of FIGS. 3 through 5 provide an improved ADC architecture whereby a conversion from analog to digital may be achieved in fewer clock cycles than required by ADC 20 of the prior art, that is, the number of clock cycles for performing the conversion is less than the number of bits in the digital output. In other words, for a symmetrically formed prior art DAC having M by M rows and columns, one skilled in the art will confirm that the number of clock cycles required to perform the analog-to-digital conversion may be stated as $2[\log_2(M)]$ clock cycles. For example, for a large DAC such as one with 32 rows and 32 columns, a total of 10 clock cycles are required (i.e., $2[\log_2(32)]=2*5=10$), where half of those clock cycles are expended in determining the upper half of the total output bits and the other half of those clock cycles are expended in determining the lower half of the total output bit. In contrast, for a symmetrically formed DAC according to the preceding teachings and having M by M rows and columns, the column determination is reduced to one clock cycle, so the total number of clock cycles required to perform the conversion is less than $2[\log_2(M)]$ and, indeed, is approximately $[\log_2(M)]+1$ (or where the addend of one is increased by a few additional clock cycles under method 60). Thus, the number of clock cycles is approximately halved. In addition, this result is also achieved with far fewer comparators and, hence, less of the costs, as are required under the alternative prior art described earlier where each tap has its own corresponding comparator. Moreover, the preferred embodiment also achieves its result with considerably reduced capacitive load as compared to the prior art approach having each of its taps connected to a corresponding comparator.

Figure 6:
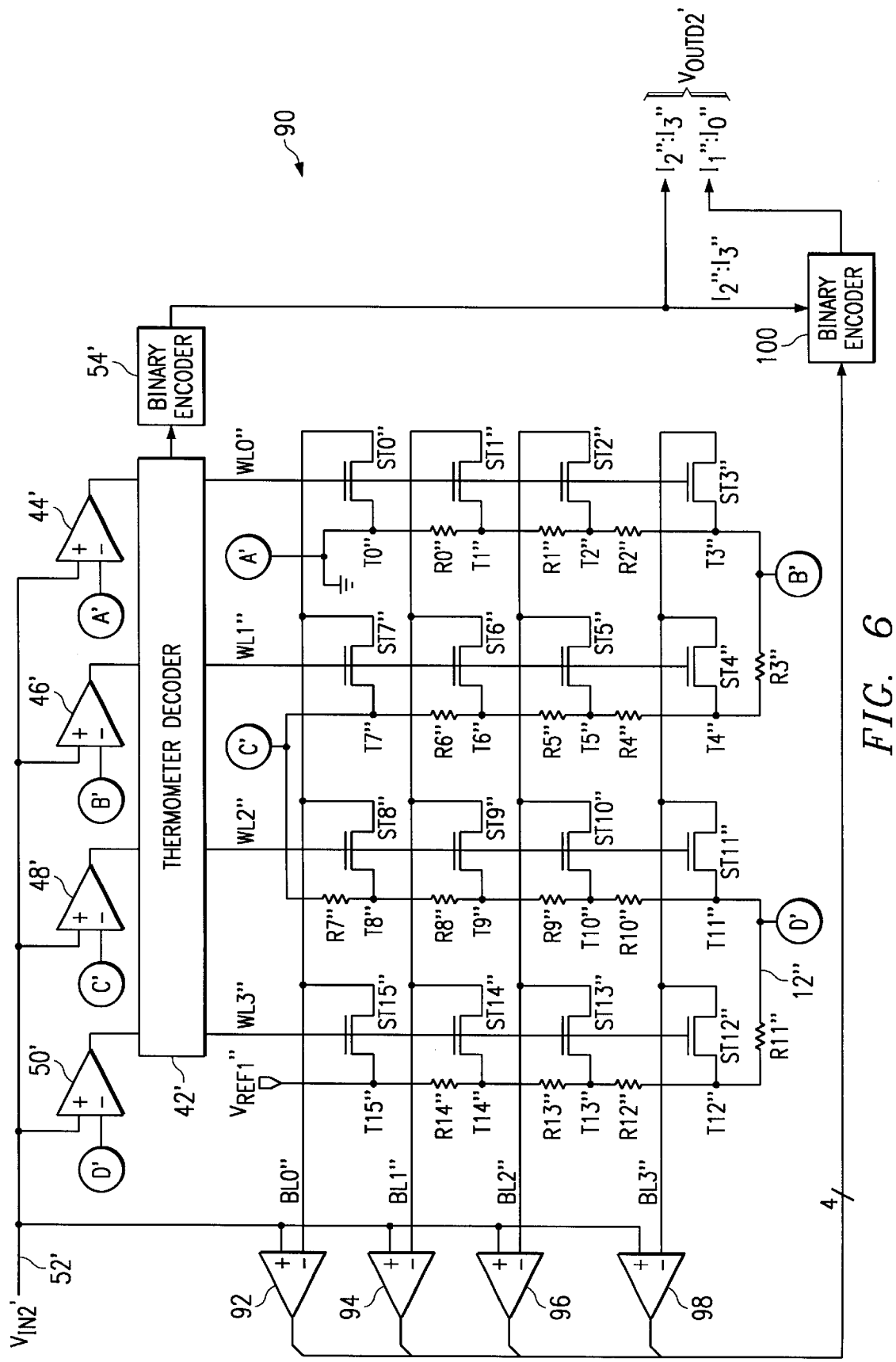
FIG. 6 illustrates a schematic of a second inventive ADC including a first group of comparators and a thermometer decoder to perform a first flash determination of the upper half of the output bits in the digital conversion, and a second group of comparators and a binary encoder to perform a second flash determination of the lower half of the output bits in the digital conversion.

FIG. 6 illustrates a schematic of an ADC 90 according to another inventive embodiment. ADC 90 includes various components that are comparable in connection and operation to components in ADC 40 of FIG. 3. To illustrate these like components in FIG. 6, they are shown with the same reference identifiers as in FIG. 3 with the exception that an apostrophe is added to the identifier such that some items now have a single apostrophe while others have a double apostrophe where only a single apostrophe was used in FIG. 3. Briefly reviewing these comparable elements of ADC 90, and assuming the reader is familiar with ADC 40, ADC 90 converts an analog input signal $V_{IN2}'$, equal to or greater than ground, to a 4-bit digital value $V_{OUTD2}'$ (having bits $I_3"$ through $I_0"$). Looking to the structure that contributes to this functionality, ADC 90 includes a DAC structure having a series-connected meander resistor string 12" with fifteen resistive elements R0" through R14", thereby giving rise to an array of corresponding taps T0" through T15" and biased in total by a reference voltage $V_{REF1}"$. The symmetric array format of the DAC structure of ADC 90 includes word lines WL0" through WL3" and bit lines BL0" through BL3"; however, for reasons detailed later in connection with the operation of ADC 90, note in FIG. 6 that word lines WL0" through WL3" are indicated vertically along the Figure while bit lines BL0" through BL3" are indicated horizontally along the Figure. Each tap is further associated with a corresponding switching transistor ST0" through ST15", where a first source/drain of each of those switching transistors is connected to a corresponding tap, but where the second source/drain of those transistors (and their gates) are connected in a manner that differs considerably from ADC 40 as described later. Continuing with other comparable items of ADC 40 and ADC 90, ADC 90 also includes a group of successive comparators 44', 46', 48', and 50', where each of those comparators has its non-inverting input coupled to an input 52' that receives the analog input voltage $V_{IN2}'$, and also where each of those comparators has its inverting input coupled to a respective node voltage shown encircled by letters A' through D'. The outputs of comparators 44', 46', 48', and 50' provide a thermometer pattern to a thermometer decoder 42' which, in response, provides a 1-of-N code. In one aspect, the 1-of-N code is coupled to a binary encoder 54' that encodes the 1-of-N code into a 2-bit binary value representing bits $I_1"$ and $I_2"$, thereby forming a part of $V_{OUTD2}'$.

Some of the various items of contrast between ADC 90 and ADC 40 arise from additional connections to the switching transistors. Specifically, the switching transistors may be considered grouped in a first sense such that, for each such group of four switching transistors the gate of each transistor is connected to the same word line, where as introduced above the word lines are aligned vertically in the schematic in FIG. 6 and, thus, so are the groupings of switching transistors. For example, connected to word line WL0" is the gate of each of switching transistors ST0", ST1", ST2", and ST3". As another example, connected to bit line WL1" is the gate of each of switching transistors ST4", ST5", ST6", and ST7". Moreover, the state of word lines WL0" through WL3" are provided from thermometer decoder 42'. Additionally, the second source/drain of each of the switching transistors is connected to one of bit lines BL0" through BL3". More particularly, the switching transistors may be considered grouped in a second sense such that, for each such group of four switching transistors the second source/drain of each transistor is connected to the same bit line, where each transistor in the group is aligned horizontally in the schematic in FIG. 6. For example, connected to word line BL0" is the second source/drain of each of switching transistors ST0", ST7", ST8", and ST15". As another example, connected to bit line BL1" is the second source/drain of each of switching transistors ST1", ST6", ST9", and ST14".

Additional items of contrast between ADC 90 and ADC 40 arise from the output signals from the DAC architecture of ADC 90. More particularly, each of bit lines BL0" through BL3" is connected to the inverting input of a respective comparator 92 through 98, while the non-inverting inputs of those comparators is connected to receive $V_{IN2}'$. The outputs of comparators 92 through 98 are connected to a binary encoder 100 that also receives the upper half of output bits which, in the present example, consists of bits $I_2"$ and $I_3"$. Binary encoder 100 outputs the values of bits $I_1"$ and $I_0"$ and, hence, ultimately those bits may be combined with the output of binary encoder 54' (i.e., bits $I_3"$ and $I_2"$) to provide the converted digital value $V_{OUTD2}'$. stop The operation of ADC 90 is as follows and is also shown by way of a flow chart method 110 shown in FIG. 7, and here demonstrates the conversion of the input analog signal $V_{IN2}'$ to the digital output value $V_{OUTD2}'$. Like ADC 40, ADC 90 converts $V_{IN2}'$ to a digital voltage by identifying a tap having a voltage which is nearest to and above $V_{IN2}'$ and then outputting as $V_{OUTD2}'$ (i.e., bits $I_0":I_3"$) the address of that voltage tap. In the preferred embodiment, this conversion is a two step methodology, where each step involves a flash comparison as detailed below and, where, more particularly, the first flash comparison yields the column along which the selected tap is aligned and the second flash comparison yields the row along which the selected tap is aligned. Each of these two steps is discussed in greater detail below. Lastly, to facilitate the remaining discussion of ADC 90, an example of its operation is examined where an input voltage $V_{IN2}'$ is closest to and below the voltage at tap T5". Accordingly, one skilled in the art should therefore expect that the output of ADC 90 will provide a digital value of $V_{OUTD2}'$ equal to 0101 (i.e., binary five), and that expectation is confirmed below.

The first step of operation of ADC 90 is broken down within method 110 into four blocks 62', 64', 66', and 112 where the combined operation of these blocks preferably occurs within a single clock cycle, and where blocks 62', 64', and 66' are first discussed and operate in a comparable manner as blocks 62, 64, and 66 discussed above with respect to FIG. 4. Briefly, therefore, in block 62' $V_{IN2}'$ is compared by comparators 44', 46', 48', and 50' to their respective node voltages A' through D' and, thus, in a single flash comparison a thermometer pattern is formed. For the example where $V_{IN2}'$ corresponds to tap T5', the thermometer pattern equals 0011. In block 64', the thermometer pattern is coupled to thermometer decoder 42'. In block 66', thermometer decoder 42' provides a 1-of-N code that indicates by a set bit the location of the most significant set bit in the thermometer pattern. For the example where $V_{IN2}'$ corresponds to tap T5', the 1-of-N code equals 0010. This 1-of-N code is coupled to a binary encoder 54' which converts the code into a 2-bit value equal to the bit location of the set bit, and that value represents the two most significant bits $I_2"$ and $I_3"$ of the digital conversion. For the example where $V_{IN2}'$ corresponds to tap T5' and given the 1-of-N code equal to 0010, bit location 1 is set and hence the converted 2-bit value equals 01 (i.e., binary 1). In addition, the 1-of-N code is coupled via the corresponding word lines to the gates of each column of n-channel switching transistors. Accordingly, since the 1-of-N code includes one set bit, it provides an enabling potential to each transistor aligned in the column that receives the one set bit. Thus, for the example where $V_{IN2}'$ corresponds to tap T5' and given the 1-of-N code equal to 0010, word line WL1" receives an enabling potential while word lines WL0", WL2", and WL3" do not. In this regard, note that the first flash comparison selects an entire group, or word, in the memory sense. It is for this reason that the vertically aligned enabling lines in FIG. 6 are deemed the word lines, and similarly it will be shown below that a selection of a single bit amount the enabled word is then done by a bit line, albeit it in a horizontal dimension. Lastly in this regard, note therefore that in ADC 90 the resistive elements are aligned with the word lines; for further details on a layout implementation of such an architecture, the reader is referred to U.S. patent application Ser. No. 09/342,877, entitled "Data Converter With Horizontal Diffusion Resistor Meander," filed Jun. 21, 1999 having the same inventors as the present application, and hereby incorporated herein by reference.

In block 112, the enabling signal from the 1-of-N code enables one column of switching transistors. Thus, for the example where $V_{IN2}'$ corresponds to tap T5' and WL1" is asserted, then each of switching transistors ST4", ST5", ST6", and ST7" are enabled. Also in block 112, binary encoder 54' encodes the binary sequence into a 2-bit value equal to the bit position of the set bit in the 1-of-N code. Thus, for the example where $V_{IN2}'$ corresponds to tap T5' and given the 1-of-N code equal to 0010, the set bit is in bit position 1. Accordingly, binary encoder 54' encodes this value to binary 01, and this value is thereafter available as bits $I_3"$ and $I_2"$ of $V_{OUTD2}'$. The other two bit values for $V_{OUTD2}'$ are thereafter determined by the remaining step of method 110, as discussed below.

The second step of operation of ADC 90 is broken down within method 110 into two blocks 114 and 116, where the combined operation of these blocks also preferably occurs within a single clock cycle. Turning to the first of those blocks, in block 114 $V_{IN2}'$ is compared by comparators 92, 94, 96, and 98 to their respective voltages provided by the column of switching transistors enabled in block 112. In other words, note now that block 112 permits each switching transistor having its gate connected to the asserted word line to pass the tap voltage from one of its source/drains to the bit line connected to the other of its source/drains. For the example where $V_{IN2}'$ corresponds to tap T5', recall that the switching transistors along word line WL1" are enabled. Thus, switching transistor ST4" connects the tap voltage from tap T4" to bit line BL3", transistor ST5" connects the tap voltage from tap T5" to bit line BL2", and so forth. Accordingly, each of comparators 92, 94, 96, and 98 in a single instance or "flash" compares $V_{IN2}'$ to the voltage at their respective inverting inputs. The outputs of these comparators, therefore, form a second thermometer pattern. Taking the output of comparator 92 as the least significant bit in this pattern, and for the example where $V_{IN2}'$ is slightly below tap T5', then the value of the second thermometer pattern equals 1110. This thermometer pattern is coupled to binary encoder 100.

Figures 7, 8:
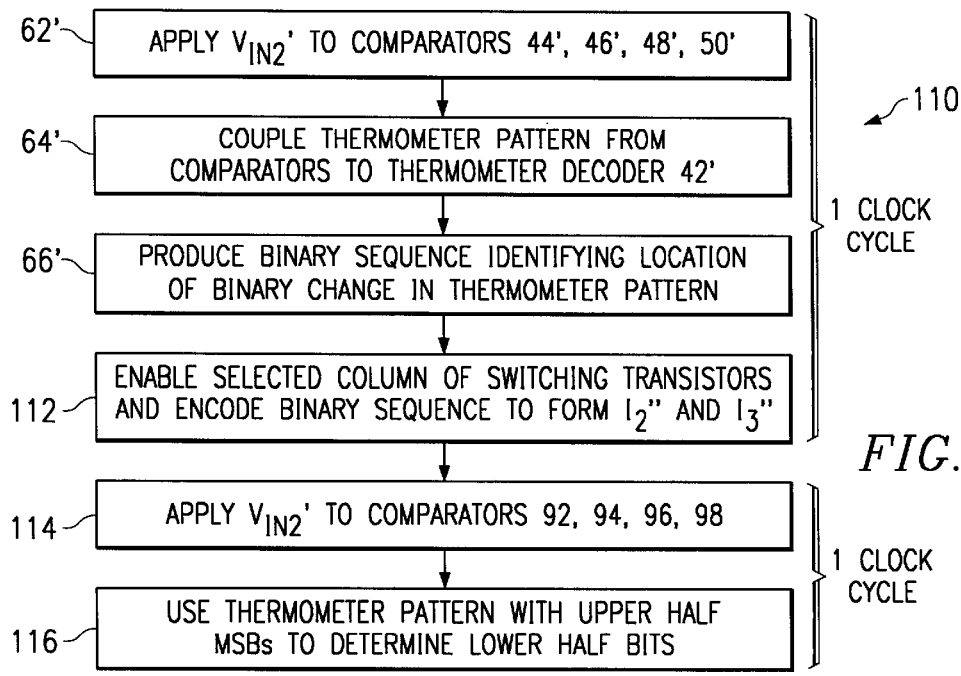
FIG. 7 illustrates a flow chart of the method of operation of the ADC of FIG. 6.
FIG. 8 illustrates a truth table describing the operation of binary encoder 100 in FIG. 6.

In block 116, the second thermometer pattern, as produced from block 114, is processed by binary encoder 100, as further appreciated from the table of FIG. 8. Specifically, the first column of FIG. 8 identifies the taps of the DAC in ADC 90, and the second through fifth columns indicate the thermometer pattern that results when $V_{IN2}'$ is closest to but below the voltage of the tap listed in the first column. From the thermometer patterns, it may be appreciated that some taps give rise to the same thermometer pattern, such as is the case with respect to taps T4" and T8". However, recall that binary encoder 100 is further connected to receive the values of bits $I_2"$ and $I_3"$ and, thus, these values are shown in the sixth column of FIG. 8. Accordingly, given those additional values one skilled in the art may construct various circuits, such as a logic array, that may determine from the combination of the thermometer pattern and the earlier-determined upper half bits (i.e., $I_2"$ and $I_3"$ in the example shown) the values of the lower half bits (i.e., $I_0"$ and $I_1"$ in the example shown) as shown in the final column of FIG. 8. Once the lower half of bits are determined, they are then combined with the earlier-determined upper half bits to form the final digital output value for $V_{OUTD2}'$.

From the above, it now should be appreciated that the embodiments of FIGS. 6 through 8 also provide an improved ADC architecture whereby a conversion from analog to digital may be achieved in far fewer clock cycles than required by ADC 20 of the prior art and, indeed, for the latter embodiment of FIG. 6 the number of clock cycles typically equals two. Such is the case regardless of the dimensions of the DAC array. In addition, note that the number of comparators is considerably less than the alternative prior art described earlier where each tap has its own corresponding comparator. More particularly, for such a prior art DAC having $2^T$ taps, a total of $2^T$ comparators are required. For example, where T equals 8, then 256 comparators are required. In contrast, when the DAC configuration of the ADC is formed in a symmetric manner as shown in the embodiment of FIG. 6, and stating its taps as a number equal to $2^T$, then the total number of comparators required equals $2*T$. Thus, again considering the example where T equals 8, then the embodiment of FIG. 6 requires only 16 comparators.

In conclusion, it may be appreciated that the present embodiments provide numerous advantages over the prior art, many of which have been set forth above and additional ones of which will be ascertained by one skilled in the art. In addition, while the present embodiments have been described in detail, various substitutions, modifications or alterations could be made to the descriptions set forth above without departing from the inventive scope. Indeed, some of these type of variations have been set forth above, and still others may be ascertained. For example, while a DAC with a relatively small number of taps has been illustrated, the present teachings apply equally if not more beneficially to ADCs with larger numbers of taps. As another example, while the second flash operation of ADC 90 has been shown through a single binary encoder, one skilled in the art may develop an alternative configuration based on an approach similar to that used in the first flash operation, thereby involving other decoding and encoding apparatus. As another example, while the terms bit line and word line have been associated above with the vertical and horizontal dimension, the preceding teachings may be applied in comparable configurations where bit lines are considered horizontal and word lines vertical. As still another example, while a single flash determination is made with respect to only the bit lines in FIG. 3, an alternative embodiment contemplated using the single flash determination with respect to selection of only the word line corresponding to the input analog voltage. As yet another example, while symmetric arrays have been illustrated and are likely preferred due to layout considerations, many of the preceding teachings may apply to an asymmetric array. Still further, conductivity types and bit states may be altered using complementary types and states. In all events, therefore, the preceding as well as other ascertainable examples should further illustrate the inventive scope, where that scope is defined by the following claims.

What is claimed is:

1. An analog-to-digital converter, comprising:
an input for receiving an input analog voltage;
a digital-to-analog circuit, comprising:
  a meandering string of series connected resistive elements, wherein the string comprises a plurality of voltage taps;
  a number of bit lines;
  a number of word lines,
  wherein, for a given input analog voltage, the given input analog voltage is closest to a voltage at a selected one of the plurality of taps; and
  wherein the selected one of the plurality of taps is associated with one of the number of bit lines and one of the number of word lines;
and wherein the analog-to-digital converter further comprises:
  a flash circuit coupled to receive the input analog voltage from the input and in response to identify either the one of the number of bit lines or the one of the number of word lines; and
  an output for providing a digital output value in part in response to the identified one of the number of bit lines or the one of the number of word lines.

2. The analog-to-digital converter of claim 1:
wherein the flash circuit is coupled to receive the input analog voltage and in response to identify the one of the number of bit lines;
wherein the number of bit lines consists of an integer N number of bit lines; and
wherein the flash circuit comprises the integer N of comparators, each having a first input and a second input, wherein each of the comparators is coupled to receive at its first input the input analog voltage from the input and is coupled to receive at its second input a voltage from a different one of the plurality of voltage taps.

3. The analog-to-digital converter of claim 1:
wherein the flash circuit comprises a first flash circuit coupled to receive the input analog voltage from the input and in response to identify the one of the number of word lines; and
wherein the analog-to-digital converter further comprises:
a second flash circuit coupled to receive a plurality of tap voltages and in response to identify the one of the number of bit lines; and
encoding circuitry for providing a first binary value corresponding to the identified one of the number of word lines and for providing a second binary value corresponding to the identified one of the number of bit lines, wherein the digital output value comprises the first binary value and the second binary value.

4. The analog-to-digital converter of claim 3:
wherein the number of bit lines consists of an integer N number of bit lines; and
wherein the second flash circuit comprises the integer N of comparators, each having a first input and a second input, wherein each of the comparators is coupled to receive at its first input the input analog voltage and is coupled to receive at its second input a voltage from a different one of the plurality of voltage taps, wherein each of the different one of the plurality of voltage taps is aligned along a common one of the number of word lines.

5. An analog-to-digital converter comprising: an input for receiving an input analog voltage;
a digital-to-analog circuit, comprising:
  a meandering string of series connected resistive elements, wherein the string comprises a plurality of voltage taps;
  a number of bit lines;
  a number of word lines;
  wherein each of the number of bits lines and the number of word lines equals an integer M;
  wherein the flash circuit identifies either the one of the number of bit lines or the one of the number of word lines in a number of clock cycles less than a number equal to two times a base two algorithm of M;
  wherein, for a given input analog voltage, the given input analog voltage is closest to a voltage at a selected one of the plurality of taps; and
  wherein the selected one of the plurality of taps is associated with one of the number of bit lines and one of the number of word lines;
and wherein the analog-to-digital converter further comprises:
  a flash circuit coupled to receive the input analog voltage from the input in response to identify either the one of the number of bit lines or the one of the number of word lines; and
  an output for providing a digital output value in part in response to the identified one of the number of bit lines or the one of the number of word lines.

6. An analog-to-digital converter, comprising:
an input for receiving an input analog voltage;
a digital-to-analog circuit, comprising:
  a meandering string of series connected resistive elements, wherein the string comprises a plurality of voltage taps;
  a number of bit lines;
  a number of word lines;
  wherein, for a given input analog voltage, the given input analog voltage is closest to a voltage at a selected one of the plurality of taps; and
  wherein the selected one of the plurality of taps is associated with one of the number of bit lines and one of the number of word lines;
and wherein the analog-to-digital converter further comprises:
  a flash circuit coupled to receive the input analog voltage from the input in response to identify either the one of the number of bit lines or the one of the number of word lines in a single clock cycle; and
  an output for providing a digital output value in part in response to the identified one of the number of bit lines or the one of the number of word lines.

7. An analog-to-digital converter, comprising:
an input for receiving an input analog voltage;
a digital-to-analog circuit, comprising:
  a meandering string of series connected resistive elements, wherein the string comprises a plurality of voltage taps;
  a number of bit lines;
  a number of word lines;
  wherein for a given input analog voltage the given input analog voltage is closest to a voltage at a selected one of the plurality of taps; and
  wherein the selected one of the plurality of taps is associated with one of the number of bit lines and one of the number of word lines;
and wherein the analog-to-digital converter further comprises:

a flash circuit coupled to receive the input analog voltage from the input in response to identify either the one of the number of bit lines or the one of the number of word lines;

an output for providing a digital output value in part in response to the identified one of the number of bit lines or the one of the number of word lines;

wherein the flash circuit is coupled to receive the input analog voltage and in response to identify the one of the number of bit lines;

wherein the number of bit lines consists of an integer N number of bit lines;

wherein the flash circuit comprises the integer N of comparators, each having a first input and a second input, wherein each of the comparators is coupled to receive at its first input the input analog voltage from the input and is coupled to receive at its second input a voltage from a different one of the plurality of voltage taps;

wherein the integer N of comparators are operable to output a thermometer code; and wherein the flash circuit further comprises a thermometer decoder for producing a 1-of-N code consisting of a plurality of bits, wherein one of the plurality of bits is set to a first state and all bits in the plurality of bits other than the one bit are set to a second state, and wherein the 1-of-N code is for identifying a location within the thermometer code corresponding to a change between binary states of sequential bits in the thermometer code.

8. The analog-to-digital converter of claim 7:

wherein the flash circuit further comprises an encoding circuit coupled to receive the 1-of-N code and in response thereto to provide a binary output representing a bit location within the 1-of-N code corresponding to the one of the plurality of bits; and wherein the binary output forms a portion of the digital output value.

9. The analog-to-digital converter of claim 8:

wherein the digital output value consists of an even number of output bits; and wherein the binary output forms half of the output bits.

10. The analog-to-digital converter of claim 7 wherein the digital-to-analog circuit further comprises a plurality of switching transistors, each having a first source/drain connected to a unique one of the plurality of taps and having a second source/drain connected to one of the number of bit lines and having a gate connected to one of the number of word lines.

11. The analog-to-digital converter of claim 10:

wherein the flash circuit further comprises a number of column access transistors equal to the number of bit lines, wherein each of the column access transistors has a first source/drain coupled to a unique one of the bit lines and a second source/drain coupled to provide a converted analog voltage output; and wherein each gate of the number of column access transistors is coupled to receive a unique one of the plurality of bits in the 1-of-N code.

12. The analog-to-digital converter of claim 11 and further comprising:

an output comparator having a first input and second input, wherein the first input of the output comparator is coupled to receive the input analog voltage and wherein the second input of the output comparator is coupled to receive the converted analog voltage output; and a successive approximation register having an input coupled to an output of the output comparator and in response thereto to successively couple addresses to selected ones of the number of word lines to identify one of the number of word lines, wherein an address of the identified one of the number of word lines is combined with an address of the identified one of the number of bit lines to form the digital output value.

13. The analog-to-digital converter of claim 12 wherein the output comparator has a lower susceptibility to offset than each of the integer N of comparators.

14. The analog-to-digital converter of claim 13 and further comprising sequencing circuitry for operating the output comparator to confirm at least one bit in the thermometer code.

15. An analog-to-digital converter, comprising:

an input for receiving an input analog voltage;

a digital-to-analog circuit, comprising:

a meandering string of series connected resistive elements, wherein the string comprises a plurality of voltage taps;

a number of bit lines;

a number of word lines;

wherein, for a given input analog voltage, the given input analog voltage is closest to a voltage at a selected one of the plurality of taps; and wherein the selected one of the plurality of taps is associated with one of the number of bit lines and one of the number of word lines;

and wherein the analog-to-digital converter further comprises:

a flash circuit coupled to receive the input analog voltage from the input in response to identify either the one of the number of bit lines or the one of the number of word lines; and an output for providing a digital output value in part in response to the identified one of the number of bit lines or the one of the number of word lines; and wherein the flash circuit comprises a first flash circuit coupled to receive the input analog voltage from the input and in response to identify the one of the number of word lines; and wherein the analog-to-digital converter further comprises:

a second flash circuit coupled to receive a plurality of tap voltages and in response to identify the one of the number of bit lines; and encoding circuitry for providing a first binary value corresponding to the identified one of the number of word lines and for providing a second binary value corresponding to the identified one of the number of bit lines wherein the digital output value comprises the first binary value and the second binary value;

wherein the number of bit lines consists of an integer N number of bit lines; and wherein the second flash circuit comprises the integer N of comparators, each having a first input and a second input, wherein each of the comparators is coupled to receive at its first input the input analog voltage and is coupled to receive at its second input a voltage from a different one of the plurality of voltage taps wherein each of the different one of the plurality of voltage taps is aligned along a common one of the number of word lines;

wherein the number of bit lines consists of an integer M number of bits lines; and wherein the first flash circuit comprises the integer M of comparators, wherein each of the integer M of comparators provides an output forming a thermometer code and in response to the thermometer code the first flash circuit identifies the one of the number of word lines.

16. The analog-to-digital converter of claim 15 wherein the integer number N equals the integer number M.

17. An analog-to-digital converter comprising:

an input for receiving an input analog voltage;

a digital-to-analog circuit, comprising:
- a meandering string of series connected resistive elements, wherein the string comprises a plurality of voltage taps;
- a number of bit lines;
- a number of word lines, wherein the number of bit lines equals the number of word lines;
- wherein, for a given input analog voltage the given input analog voltage is closest to a voltage at a selected one of the plurality of taps; and
- wherein the selected one of the plurality of taps is associated with one of the number of bit lines and one of the number of word lines;

and wherein the analog-to-digital converter further comprises:
- a flash circuit coupled to receive the input analog voltage from the input in response to identify either the one of the number of bit lines or the one of the number of word lines; and
- an output for providing a digital output value in part in response to the identified one of the number of bit lines or the one of the number of word lines.

18. A method of operating an analog-to-digital converter comprising a digital-to-analog converter comprising a number of bit lines and a number of word lines, the method comprising the steps of:

receiving an input analog voltage;

in response to the input analog voltage, identifying in a first flash operation one of the number of bit lines;

identifying one of the number of word lines; and combining an identifier of the identified one of the number of bit lines with an identifier of the identified one of the number of word lines to form a digital output value corresponding to the input analog voltage.

19. A method of operating an analog-to-digital converter comprising a digital-to-analog converter comprising a number of bit lines and a number of word lines, the method comprising the steps of:

receiving an input analog voltage;

in response to the input analog voltage, identifying in a first flash operation one of the number of bit lines;

identifying one of the number of word lines by performing a binary search routine across the number of word lines over a number of clock cycles at least equal to the number of word lines; and combining an identifier of the identified one of the number of bit lines with an identifier of the identified one of the number of word lines to form a digital output value corresponding to the input analog voltage.

20. A method of operating an analog-to-digital converter comprising a digital-to-analog converter comprising a number of bit lines and a number of word lines, the method comprising the steps of:

receiving an input analog voltage;

in response to the input analog voltage, identifying in a first flash operation one of the number of bit lines;

identifying one of the number of word lines and, in response to the input analog voltage and the identified one of the number of bit lines, identifying in a second flash operation the one of the number of word lines; and combining an identifier of the identified one of the number of bit lines with an identifier of the identified one of the number of word lines to form a digital output value corresponding to the input analog voltage.

* * * * *